(12) United States Patent
Korol

(10) Patent No.: US 7,030,714 B2
(45) Date of Patent: Apr. 18, 2006

(54) METHOD AND APPARATUS TO MATCH OUTPUT IMPEDANCE OF COMBINED OUTPHASING POWER AMPLIFIERS

(75) Inventor: Victor Korol, Petach Tikva (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/674,385

(22) Filed: Oct. 1, 2003

(65) Prior Publication Data

US 2005/0073374 A1 Apr. 7, 2005

(51) Int. Cl.
  *H01P 5/12* (2006.01)
  *H03H 7/38* (2006.01)
(52) U.S. Cl. .................. 333/124; 365/225.7; 365/200
(58) Field of Classification Search ............... 333/124, 333/32, 24 R, 100; 365/225.7, 200
  See application file for complete search history.

(56) References Cited

U.S. PATENT DOCUMENTS

| | | | | |
|---|---|---|---|---|
| 5,430,418 A | * | 7/1995 | Blodgett | 333/100 |
| 5,886,591 A | * | 3/1999 | Jean et al. | 333/118 |
| 5,939,939 A | * | 8/1999 | Gaynor et al. | 330/124 R |
| 6,011,959 A | * | 1/2000 | Reeser et al. | 455/76 |
| 6,104,247 A | | 8/2000 | Ha | |
| 6,252,463 B1 | * | 6/2001 | Kobayashi | 330/311 |
| 6,337,666 B1 | * | 1/2002 | Bishop | 343/795 |
| 6,356,149 B1 | * | 3/2002 | Stengel et al. | 330/107 |
| 6,472,935 B1 | * | 10/2002 | King et al. | 330/51 |
| 6,522,634 B1 | * | 2/2003 | Ohashi | 370/280 |
| 6,812,808 B1 | * | 11/2004 | Gaukel et al. | 333/126 |

FOREIGN PATENT DOCUMENTS

WO WO 03/047093 5/2003

OTHER PUBLICATIONS

Frederick H. Raab, "Efficiency of Outphasing RF Power-Amplifier Systems", IEEE Transactions on Communications, vol. COM-33, No. 10, Oct. 1986, pp. 1094-1099.

Gao, S. et al., "Compact harmonics-suppressed integrated antenna for LINC transmitters", IEEE Antennas and Propagation Society International Symposium, 2002 Digest, APS, San Antonio, TX, Jun. 16-21, 2002, New York, NY, IEEE, USA, vol. 1 of 4, pp. 280-283.

(Continued)

*Primary Examiner*—Robert Pascal
*Assistant Examiner*—Kimberly E. Glenn
(74) *Attorney, Agent, or Firm*—Pearl Cohen Zedek Laizer LLP

(57) ABSTRACT

Briefly, an apparatus having a first capacitor-inductor-capacitor impedance converter operably coupled to a second capacitor-inductor-capacitor impedance converter. The first and second capacitor-inductor-capacitor impedance converter may combine a first and second signals of first and second outphasing power amplifiers and may provide a matched output impedance to a desired load.

26 Claims, 2 Drawing Sheets

OTHER PUBLICATIONS

Grundlingh, J. et al., "A High Efficiency Chireix Out-Phasing Power Amplifier for 5GHz WLAN Applications", Microwave Symposium Digest, 2004, IEEE MTT-S International, Fort Worth, TX, USA, Jun. 6-11, 2004, Piscataway, NJ, USA, IEEE, vol. 3, Jun. 6, 2004, pp. 1535-1538.

Chireix, H., "High Power Outphasing Modulation", Proceedings of the Institute of Radio Engineers, Institute of Radio Engineers, New York, NY, USA, vol. 11, No. 23, Nov. 1935, pp. 1370-1392.

Copy of the International Search Report for PCT/US2004/030978, mailed Jan. 26, 2005.

* cited by examiner

METHOD AND APPARATUS TO MATCH OUTPUT IMPEDANCE OF COMBINED OUTPHASING POWER AMPLIFIERS

BACKGROUND OF THE INVENTION

Outphasing transmitters may be used in stations of wireless communication systems such as, for example, base stations, mobile stations of cellular communication system and/or mobile unit and access point of wireless local area network (WLAN) and/or other types of wireless communication systems, if desired.

Outphasing techniques may combine two nonlinear radio frequency (RF) power amplifiers (PA's) into a linear power amplifier system. The two PA's may be driven with signals of different phases, and the phases may be controlled to provide an output signal with the desired amplitude.

The linear power amplifier system may include a combiner to combine the signal provided by the two nonlinear PA's. The combiner may include two transmission line couplers with shunt reactance. The power and efficiency of the outphasing transmitter may depend on the characteristics of the components and the architecture of the two transmission line couplers with shunt reactance.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
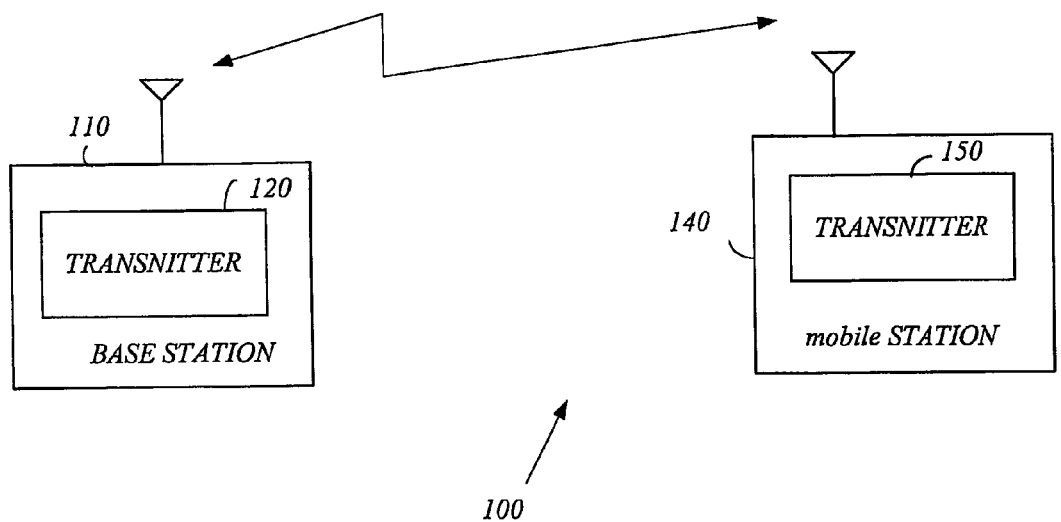
FIG. 1 is a schematic illustration of a wireless communication system according to an exemplary embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those of ordinary skill in the art that the present invention may be practiced without these specific details. In other instances, well-known methods, procedures, components and circuits have not been described in detail so as not to obscure the present invention.

Some portions of the detailed description, which follow, are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

It should be understood that the present invention may be used in a variety of applications. Although the present invention is not limited in this respect, the circuits and techniques disclosed herein may be used in many apparatuses such as transmitters of a radio system. Transmitters intended to be included within the scope of the present invention include, by a way of example only, cellular radiotelephone transmitters, two-way radio transmitters, digital system transmitters, wireless local area network transmitters, wideband transmitters, ultra wideband transmitters, and the like.

Type of cellular radiotelephone transmitters intended to be within the scope of the present invention include, although not limited to, Code Division Multiple Access (CDMA), CDMA-2000 and wide band CDMA (WCDMA) cellular radiotelephone transmitters for receiving spread spectrum signals, transmitters for global system for mobile communication (GSM), transmitters for third generation cellular systems (3 G), orthogonal frequency division multiplexing (OFDM) transmitters and the like.

Turning first to FIG. 1, a schematic illustration of a wireless communication system 100 according to an exemplary embodiment of the present invention is shown. Although the scope of the present invention is not limited to this example, wireless communication system 100 may include at least one base station 110 and at least one mobile station 140. In some embodiments of the invention base station 110 may include a transmitter 120 and mobile station 140 may include a transmitter 150. At least one of transmitters 120 and 150 may be an outphasing transmitter with reactive termination. Reactive termination may be implemented, for example, in the form of a line coupler with shunt resistance, although the scope of the present invention is in no way limited to this respect.

Although the scope of the present invention is not limited in this respect, in some embodiments of the present invention, wireless communication system 100 may be a cellular communication system. Thus, base station 110 and mobile station 140 may be a base station and a mobile station of a cellular communication system. In other embodiments of the present invention, wireless communication system 100 may be a WLAN communication system Thus, base station 110 may be an access point (AP) and mobile station 140 may be a mobile unit such as, for example, a laptop computer, a tablet computer, a handheld device and the like.

Figure 2:
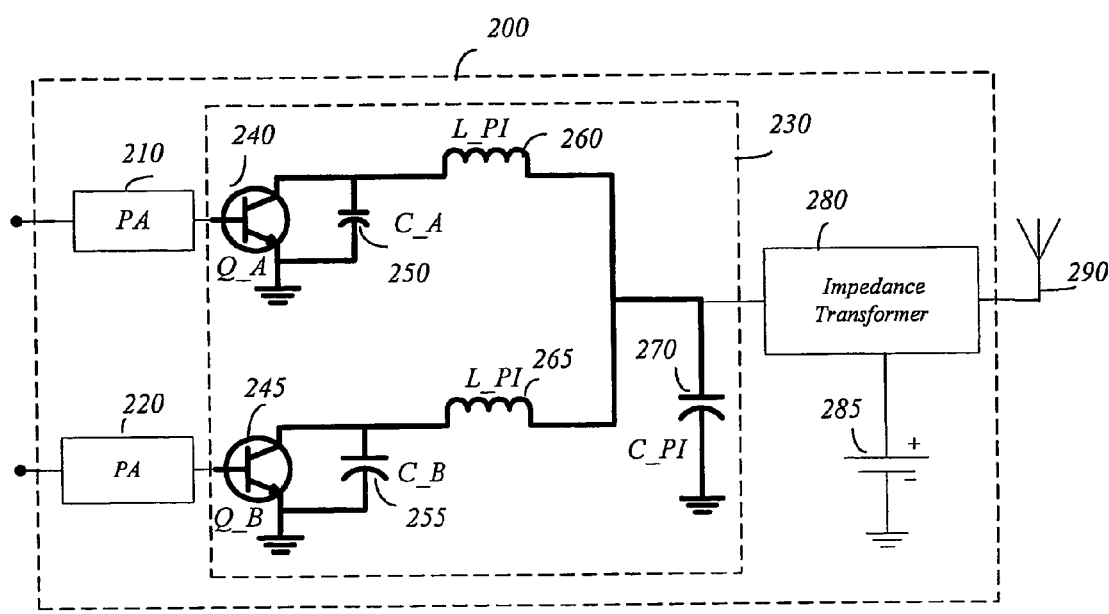
FIG. 2 is a block diagram of an outphasing amplifier according to an exemplary embodiment of the present invention.

Turning to FIG. 2, a block diagram of an outphasing transmitter 200 according to an exemplary embodiment of the present invention is shown. Although the scope of the present invention is not limited in this respect, outphasing transmitter 200 may include nonlinear PA's 210, 220, a combiner 230, impedance transformer 280, a battery 285, and an antenna 290. In some embodiments of the invention, combiner 230 may include active devices, for example transistors (Q) 240, 245 and passive devices, for example, capacitors (C) 250, 255, inductors (L) 260, 265, and capacitor (C) 270.

Although the scope of the present invention is not limited in this respect, types of antennas that may be used for antenna 290 may include an internal antenna, a dipole antenna, an omni-directional antenna, a monopole antenna, an end fed antenna, a circularly polarized antenna, a microstrip antenna, a diversity antenna and the like.

Although the scope of the present invention is not limited in this respect, impedance transformation 280 may transform, from example, the antenna impedance and/or load impedance (Zload), for example, Zload=50 Ohm to intermediate impedance (Zintermidiate) for example, Zintermidiate=20 Ohm. In this exemplary embodiment, battery 285 may provide direct current (DC) feed to active devices 240, 245 through the impedance transformer 280.

Although the scope of the present invention is not limited in this respect, combiner 230 may include two C-L-C PI (π) converters. The first π converter may include C 250 (C_A), L 260 (L_PI) and a portion of C 270 (C_PI). The second π converter may include C 255 (C_B), L 265 (L_PI) and a portion of C 270 (C_PI). The first and the second π converters may convert the impedance of Zintermidiate to the transistors 240, 245 impedance ($Z_{PA}$). In some embodiments of the invention C 270 may be expressed as C_PI=2*Cπ. The capacitance of $C_\pi$ and the inductance of inductor 260 or inductor 265 ($L_\pi$) may be expressed calculated using the following equations:

$$C_\pi = \frac{1}{\omega_{CENTER} \cdot \sqrt{2 \cdot Z_{INTER} \cdot Z_{PA}}} \quad \text{-}\pi\text{- section capacitor;} \quad (1)$$

$$L_\pi = \frac{\sqrt{2 \cdot Z_{INTER} \cdot Z_{PA}}}{\omega_{CENTER}} \quad \text{-}\pi\text{- section inductor;} \quad (2)$$

wherein $\omega_{CENTER}$ may be the center frequency of the signal that received from PA's 210 and 220.

Although the scope of the present invention is not limited in this respect, in some alternate embodiments of the present invention, the first and the second π converters may include second harmonic traps (not shown), which may be used to remove the second harmonic of transistors 240, 245, thus reducing the voltage peaking at the transistors. Although the scope of the present invention is not limited in this respect, other harmonic components may be filtered by π-section capacitor C_A (referenced 250) and/or capacitor C_B (referenced 255).

Although the scope of the present invention is not limited in this respect, shunt reactance may cause admittance shifts (±j*BS) wherein, BS is an amount of reactive admittance shift measured in mhos (e.g. 1/Ω). For example, positive admittance shift +j*BS may be accomplished by providing a shunt capacitor with the capacitance equal to $BS/\omega_{CENTER}$ Farads. In the same fashion, negative admittance shift, −j*BS, may be accomplished by providing a shunt inductor with an inductance equal to $1/(BS*\omega_{CENTER})$ Henry. In embodiments of the present invention, the admittance shifts may be added to capacitors C_A and C_B. These shifts may be defined in terms of $K_{BS}$ which is the ratio of shift impedance to maximum power PA load impedance $Z_{PA}$. $K_{BS}$ may be expressed as follows:

$$K_{BS} = \frac{1/BS}{Z_{PA}} \quad (3)$$

wherein $K_{BS}$ represents BS in terms of $Z_{PA}$. For example, $K_{BS}$ may be about 4 and $Z_{PA}$ may be related to the optimum PA load at maximum output power.

Although the scope of the present invention is not limited in this respect, capacitor C_A may be calculated according to the following equation:

$$C\_A = C_\pi - \frac{1}{3\omega_1^2 \cdot L_{RES}} - \frac{Z_{PA1} \cdot K_{BS}}{\omega_1} \quad (4)$$

wherein $\omega_1$ is the fundamental harmonic of the input signal, $L_{RES}$ may be the resonance of the second harmonic trap, and $Z_{PA1}$ may be the output impedance of transistor 240. In embodiments of the invention, capacitor C_A may be designed to have a positive value.

Although the scope of the present invention is not limited in this respect, capacitor C_B may be calculated according to the following equation:

$$C\_B = C_\pi - \frac{1}{3\omega_1^2 \cdot L_{RES}} - \frac{Z_{PA2} \cdot K_{BS}}{\omega_1} \quad (5)$$

wherein $Z_{PA2}$ is the output impedance of transistor 245. In some embodiments of the invention, the term $$\frac{1}{3\omega_1^2 \cdot L_{RES}}$$

in Equations (4) and (5) may represent compensation for the admittance shift of the second harmonic resonator, although the scope of the present invention is not limited in this respect. In some other embodiments of the present invention, the second harmonic may not be used. For those embodiments, the term $$\frac{1}{3\omega_1^2 \cdot L_{RES}}$$

in Equations (4) and (5) may be omitted.

Although the scope of the present invention is not limited in this respect, transistors 240 and 245 may include bipolar transistors, field effect transmitters (FET), metal oxide substrate field effect transistors (MOSFET), Heterojunction Bipolar Transistors (HBT), Complementary Metal Oxide Semiconductors (CMOS), High Electron Mobility Transistors (HEMT), Laterally Diffused Metal Oxide Semiconductors (LDMOS), tubes, or the like. In some embodiments of the invention, transistors 240 and 245 may be bipolar transistors and equivalent to a collector-emitter capacitance $C_{CE}$, which may be expressed as $$C_{CE} = \frac{Z_{PA} \cdot K_{BS}}{\omega_1}$$

and may be absorbed in capacitor C_B. An equivalent to a collector-emitter inductance $L_{CE}$ may be expressed as $$L_{CE} = \frac{\omega_1}{Z_{PA} \cdot K_{BS}}$$

and may be absorbed in capacitor C_A in the form of equivalent negative capacitance $$-C_{CE} = -\frac{Z_{PA} \cdot K_{BS}}{\omega_1}. \qquad 5$$

Although the scope of the present invention is not limited in this respect, the selection of $K_{BS}$ and an intermediate transformation ratio may not result in the negative capacitor C_A value in Equation (4).

Figure 3:
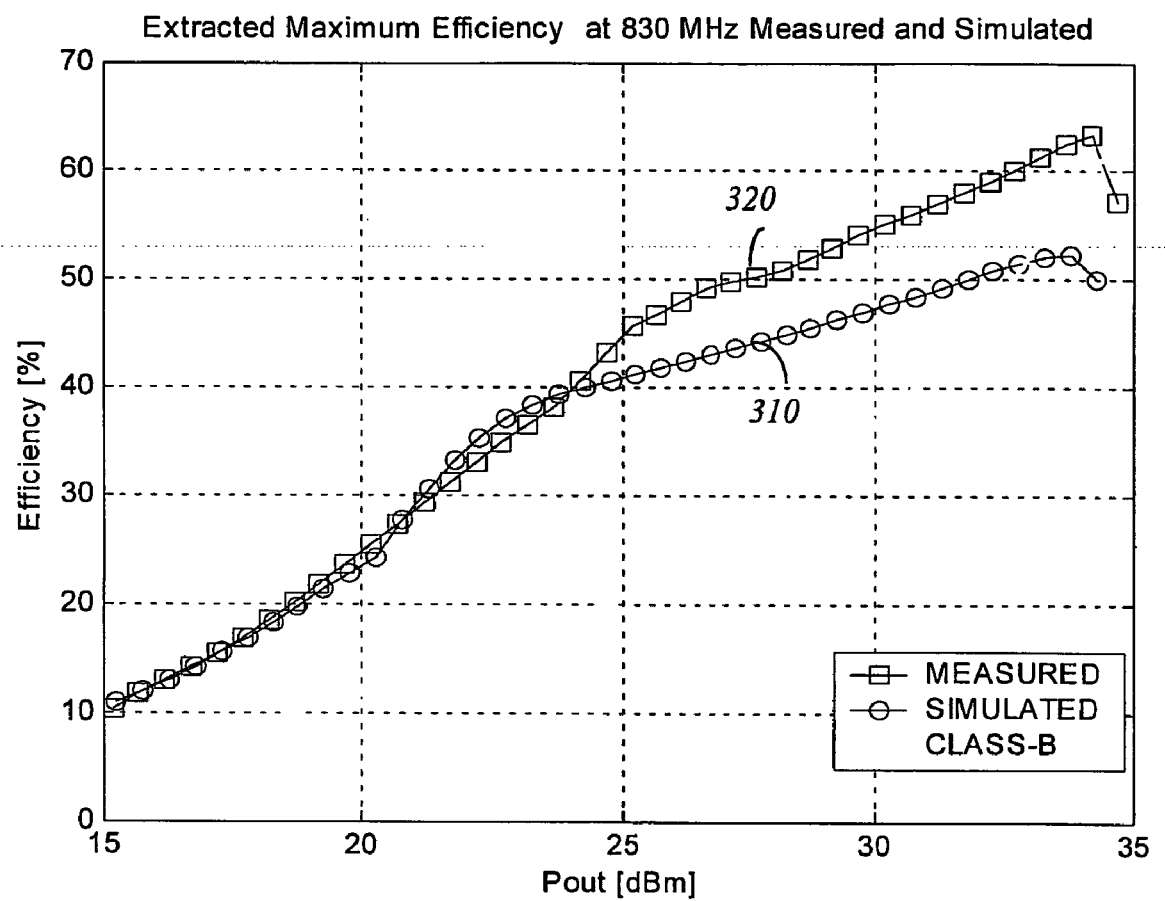
FIG. 3 is a schematic illustration of graphs helpful in demonstrating the efficiency of an outphasing amplifier according to an exemplary embodiment of the present invention.

Reference is now made to FIG. 3, which schematically illustrates graphs 310, 320 helpful in demonstrating the efficiency of an outphasing transmitter according to an exemplary embodiment of the present invention. Graph 310 and 320 depict the efficiency of transmitter 200 as a function of variations in the output power. Both graphs indicate an increase in efficiency when the output power is increased. The first graph 310 represents exemplary simulation results while the second graph represents results of actual measurements performed on a transmitter according to embodiments of the invention. It should be noted that graphs 310, 320 represent merely examples of efficiency curves and that actual efficiency curves of embodiments of the present invention may vary according to specific designs and implementations. It should be understood that the scope of the present invention is in no way limited to those examples.

While certain features of the invention have been illustrated and described herein, many modifications, substitutions, changes, and equivalents will now occur to those skilled in the art. It is, therefore, to be understood that the appended claims are intended to cover all such modifications, substitutions, changes and equivalents as may fall within the true spirit of the invention.

What is claimed is:

1. An apparatus comprising:
   a first active component coupled to a first capacitor of a first capacitor-inductor-capacitor impedance converter, to filter out a second harmonic of a first signal; and
   a second active component coupled to a first capacitor of a second capacitor-inductor-capacitor impedance converter, to filter out a second harmonic of a second signal,
   wherein the first and second capacitor-inductor-capacitor impedance converters are coupled by a shared capacitor to combine said first and second signals inputted to the first and second active components, respectively.

2. The apparatus of claim 1, wherein a capacitance of the first capacitor of the first capacitor-inductor-capacitor impedance converter is different from the capacitance of the first capacitor of the second capacitor-inductor-capacitor impedance converter, and wherein the capacitance of the first-capacitors of the first and second capacitor-inductor-capacitor impedance converters are both different from the capacitance of the shared capacitor.

3. The apparatus of claim 1, wherein the first and second active components comprise transistors.

4. The apparatus of claim 3, wherein the transistors are bipolar transistors.

5. A communication device comprising:
   a dipole antenna operably coupled to an outphasing transmitter, which comprises first and second non linear power amplifiers; and
   a combiner to combine first and second signals provided by the first and second non linear power amplifiers of the outphasing transmitter, wherein the combiner includes a first active component coupled to a first capacitor of a first capacitor-indicator-capacitor impedance converter, to filter out a second harmonic of a first signal of the first non linear power amplifier, and a second active component coupled to a first capacitor of a second capacitor-inductor-capacitor impedance converter, to filter out a second harmonic of the second signal of the second non linear power amplifier.

6. The communication device of claim 5, wherein the first capacitor-inductor-capacitor impedance converter and the second capacitor-inductor-capacitor impedance converter are coupled by a shared capacitor.

7. The communication device of claim 6, wherein the capacitance of the first capacitor of the first capacitor-inductor-capacitor impedance converter is different than the capacitance of the first capacitor of the second capacitor-inductor-capacitor impedance converter, and wherein the capacitance of input capacitors of the first and second capacitor-inductor-capacitor impedance converters are both different from the capacitance of the shared capacitor.

8. The communication device of claim 5, wherein the first and second active components comprise transistors.

9. The communication device of claim 8, wherein the transistors are bipolar transistors.

10. The communication device of claim 5, wherein the outphasing transmitter comprises:
    an impedance transformer to provide a direct current (DC) voltage to the first and second active components.

11. The communication device of claim 5, wherein the first active component is able to set a positive capacitance to the first capacitor of the first capacitor-inductor-capacitor impedance converter, and wherein the second active component is able to set a negative capacitance to the first capacitor of the second capacitor-inductor-capacitor impedance converter.

12. A method comprising:
    providing impedance matching between a combination of first and second power amplifiers and a desired load by assigning first and second capacitance values to first and second capacitors, respectively, associated with said combination; and
    filtering out a second harmonic of first and second signals provided by the first and second power amplifiers, respectively.

13. The method of claim 12, comprising assigning different capacitance values to the first and second capacitors.

14. The method of claim 12, comprising:
    setting a positive capacitance to the first capacitor; and
    setting a negative capacitance to the second capacitor.

15. A wireless communication device comprising:
    an outphasing transmitter, which comprises first and second non linear power amplifiers to output first and second signals, respectively; and
    a combiner able to combine said first and second signals of first and second non linear power amplifiers, respectively, wherein the combiner includes a first active component coupled to a first capacitor of a first capacitor-inductor-capacitor impedance converter, to filter out a second harmonic of the first signal of the first non linear power amplifier, and a second active component coupled to a first capacitor of a second capacitor-inductor-capacitor impedance converter, to filter out a second harmonic of a second signal of the second non linear power amplifier.

16. The wireless communication device of claim 15, wherein the first capacitor-inductor-capacitor impedance converter and the second capacitor-inductor-capacitor impedance converter are coupled by a shared capacitor.

17. The wireless communication device of claim 16, wherein the capacitance of the first capacitor of the first capacitor-inductor-capacitor impedance converter is different than the capacitance of the first capacitor of the second capacitor-inductor-capacitor impedance converter, and wherein the capacitance of the first capacitors of the first second capacitor-inductor-capacitor impedance converters are both different from the capacitance of the shared capacitor.

18. The wireless communication device of claim 17, wherein the first and second active components comprise transistors.

19. The wireless communication system of claim 15, wherein the outphasing transmitter comprises:
an impedance transformer to provide a direct current (DC) voltage to the first and second active components.

20. The wireless communication system of claim 15, wherein the first active component is able to set a positive capacitance to the first capacitor of the first capacitor-inductor-capacitor impedance converter, and wherein the second active component is able to set a negative capacitance to the first capacitor of the second capacitor-inductor-capacitor impedance converter.

21. A wireless communication system comprising:
a station having an outphasing transmitter comprises first and second non linear power amplifiers coupled to a combiner having a first active component coupled to a first capacitor of a first capacitor-inductor-capacitor impedance converter, to filter out a second harmonic of a first signal of the first non linear power amplifier, and a second active component coupled to a first capacitor of a second capacitor-inductor-capacitor impedance converter, to filter out a second harmonic of a second signal of the second non linear power amplifier, wherein the first and second capacitor-indicator-capacitor impedance converters are able to combine said first and second signals of first and second non linear power amplifiers, respectively.

22. The wireless communication system of claim 21, wherein the first capacitor-inductor-capacitor impedance converter and the second capacitor-inductor-capacitor impedance converter are coupled by a shared capacitor.

23. The wireless communication system of claim 22, wherein the capacitance of the input capacitor of the first capacitor-inductor-capacitor impedance converter is different than the capacitance of the input capacitor of the second capacitor-inductor-capacitor impedance converter, and wherein the capacitance of the input capacitors of the first and second capacitor-inductor-capacitor impedance converters are both different from the capacitance of the shared capacitor.

24. The wireless communication system of claim 21, wherein the first and second active components comprise transistors.

25. The wireless communication system of claim 21, wherein the outphasing transmitter comprises:
an impedance transformer to provide a direct current (DC) voltage to the first and second active components.

26. The wireless communication system of claim 21, wherein the first active component is able to set a positive capacitance to the first capacitor of the first capacitor-inductor-capacitor impedance converter and the second active component is able to set a negative capacitance to the first capacitor of the second capacitor-inductor-capacitor impedance converter.

* * * * *